United States Patent [19]

Peil

[11] 4,258,338
[45] Mar. 24, 1981

[54] PULSE GENERATOR PRODUCING SHORT DURATION HIGH CURRENT PULSES FOR APPLICATION TO A LOW IMPEDANCE LOAD

[75] Inventor: William Peil, North Syracuse, N.Y.

[73] Assignee: General Electric Company, Syracuse, N.Y.

[21] Appl. No.: 974,253

[22] Filed: Dec. 29, 1978

[51] Int. Cl.$^3$ ............................................. H03K 3/30
[52] U.S. Cl. .................................... 331/111; 331/112; 315/DIG. 7
[58] Field of Search ................................ 331/111, 112

[56] References Cited

U.S. PATENT DOCUMENTS

| | | | |
|---|---|---|---|
| 2,826,692 | 3/1958 | Sihvonen | 331/112 |
| 3,056,930 | 10/1962 | Berg | 331/112 X |
| 3,187,271 | 6/1965 | DeVries | 331/112 X |
| 3,296,486 | 1/1967 | Nienhuis | 331/112 X |

*Primary Examiner*—Siegfried H. Grimm
*Attorney, Agent, or Firm*—Richard V. Lang; Carl W. Baker

[57] ABSTRACT

The present invention deals with a pulse generator for generating short duration, high current pulses at a repetition rate which is substantially independent of variations in source potential, load or ambient temperature. The pulse generator employs a single transistor, relaxation oscillator configuration, in which the base electrode potential is maintained proportional to source potential and the emitter electrode potential is coupled in an RC network in which rate of change of voltage on the capacitor is proportional to the source potential. Regenerative feedback required for production of short duration, high current pulses is provided by a current transformer having a few primary and a few secondary turns wound on a magnetic core for close coupling. The output pulses, which are derived by a second current transformer, are suitable for turning on a switching transistor in a high frequency static inverter. The two current transformers may be wound through separate apertures, neutral to the main inverter flux, in a larger composite inverter core. The invention leads to an efficient, compact and low cost static inverter.

7 Claims, 2 Drawing Figures

PULSE GENERATOR PRODUCING SHORT DURATION HIGH CURRENT PULSES FOR APPLICATION TO A LOW IMPEDANCE LOAD

BACKGROUND OF THE INVENTION

1. Field of the Invention

The present invention relates to relaxation oscillators for generating periodic pulses which are suitable for turning on power switching transistors in high frequency (10 KHz–200 KHz) static inverters. The invention also relates to relaxation oscillators whose pulse repetition rates are substantially independent of source potential, load or ambient temperature.

2. Description of the Prior Art

Relaxation oscillators form a well known class of oscillators. A common member of this class employs a compound semiconductor or a two transistor PNP-NPN configuration in which a feedback connection is provided for regeneration. While such oscillators may employ feedback to sharpen the output pulses, such arrangements generally do not provide the high current, short duration pulses required for turning on switching transistors in higher frequency static inverters. Furthermore, the pulse repetition rates of such relaxation oscillators, which are dependent upon the time constant of a resistance capacitance network are generally subject to one of several kinds of frequency instability.

SUMMARY OF THE INVENTION

Accordingly, it is an object of the present invention to provide an improved relaxation oscillator.

It is still another object of the present invention to provide a relaxation oscillator which has improved stability in respect to variations in source potential, load or ambient temperature.

It is still another object of the present invention to provide a pulse generator having improved stability, which is capable of generating a high current pulse of short duration for application to a low impedance load.

it is still another object of the present invention to provide an improved pulse generator suitable for recurrently turning on a switching transistor in a static inverter operating at a high switching rate.

It is a further object of the present invention to provide an improved inverter having a power inductor and a transistor switch controlled by a pulse generator.

It is still another object of the invention to provide an improved inverter having a power inductor and a transistor switch controlled by a pulse generator, all three elements sharing a common magnetic core structure.

These and other objects of the invention are achieved in a novel single transistor pulse generator. The generator comprises a transistor energized from a dc source having a base input electrode and emitter and collector output electrodes. The collector is coupled to one source terminal and the emitter is coupled through a resistor to the other source terminal. A resistive voltage divider is provided coupled across the dc source having a tap coupled to the base electrode to establish the base potential at a predetermined fraction of the source potential. A capacitor is provided coupled between the emitter and the collector so that the resistor and transistor provide paths for alternately charging and discharging the capacitor. The repetition rate is substantially independent of source potential and is determined by the values of the resistor, the capacitor, and the voltage difference on the capacitor established by the voltage divider between a charged and a discharged condition.

To produce a high current, short duration pulse, a feedback transformer is provided having a primary winding closely coupled through a magnetic core to a secondary winding, the primary winding being connected in series with the transistor across the dc source and the secondary winding being coupled between the base and the emitter electrodes in a regenerative sense through a capacitor. A third low impedance winding connected in series with the primary winding of the auto transformer, and also associated with a core, forms a low impedance primary winding of a second transformer. Short duration, high current pulses are produced in the secondary of this second transformer when transistor conduction occurs. These pulses are suitable for switching on a power transistor.

Preferably, both transformers are low impedance current transformers. In the embodiment illustrated, the primary feedback winding and the secondary feedback winding form an auto transformer, with the primary portion being connected between the emitter electrode and a connection between the capacitor and the resistor. The remaining portion of the auto transformer is capacitively connected to the base electrode. This arrangement largely avoids the circulation of pulse currents through the power supply.

In accordance with a further aspect of the invention, the magnetic cores of the current transformers are a part of a larger magnetic structure of a static inverter for applying power to a load. The magnetic structure provides a path for main power flux and has a power winding associated with it. A first aperture means is provided, neutrally positioned in the magnetic structure in respect to the main power flux for the windings of the feedback current transformer. A second aperture means is provided neutrally positioned in the magnetic structure in respect to the main power flux and physically remote from the first aperture means for the windings of the second current transformer. A power transistor switches current in the power winding under control of pulses coupled from the pulse generator by means of the second current transformer.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DESCRIPTION OF THE PREFERRED EMBODIMENTS

Figure 1:
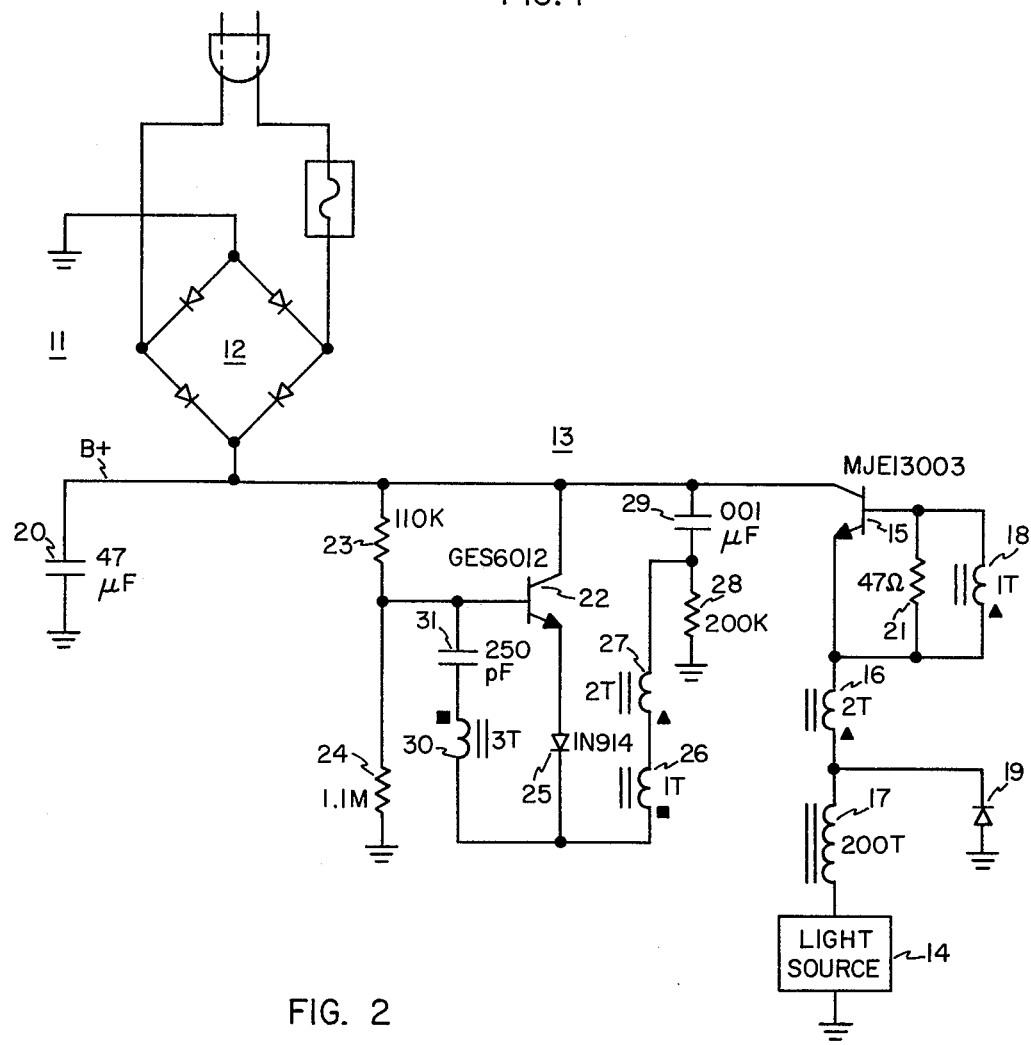
FIG. 1 is an electrical circuit diagram of a power supply for a gas discharge light source. The supply includes a novel static inverter which comprises a main transistor switch, and a separate stable pulse generator for control of the transistor switch.

Referring now to FIG. 1, a static inverter employing a novel pulse generator 13 is illustrated as a portion of a power supply for a light source 14. The power supply consists of a dc supply 11. The static inverter and the light source 14 are connected across the dc supply. The inverter principally consists of a switching transistor 15, a power transformer, and a flyback diode 19. The power supplied to the light source 14 is dc with the inductance of the transformer winding 17 supplying current during nonconduction of the switching transistor through a "flyback" diode 19. The pulse generator 13 produces a trigger pulse at a specified repetition rate normally between 10 and 200 KHz for recurrently turning on the switching transistor 15. The trigger pulse is of high current, typically from 0.5 to 1 amps, and of a short duration dependent on the application. The transformer feedback windings 16 and 18, provide means for recurrently turning off the switching transistor. The pulse repetition rate of the pulse generator 13 is designed to be substantially independent of variations in temperature, line voltage, or power demanded by the light source.

The dc supply 11, which energizes the pulse generator 13, consists of a bridge rectifier 12 coupled to a 120 V 60 hertz source and a filter capacitor 20 connected across the rectifier output terminal. The dc supply produces an output of 145 volts which may have appreciable (±10%) 120 hertz ripple under load. The average output voltage of the dc supply is dependent upon both line voltage and power demand by the light source 14. The pulse generator 13 is connected across the output terminals of the dc supply 11 and is thus subject to variations in its output voltage.

The light source power supply or inverter, which is not in itself the subject of the present invention, is connected as follows. The collector of transistor 15 is connected to the positive terminal of the dc supply 11 and the emitter of the transistor 15 is connected to the undotted terminal of a primary feedback winding 16 of the transformer. The dotted terminal of the feedback winding 16 is connected to the upper terminal of the main power winding 17. The other terminal of winding 17 is connected to one terminal of the light source 14. The other light source terminal is grounded. The connection between the windings 16 and 17 is connected through the "flyback" diode 19 to ground, the diode 19 having its anode grounded. A secondary feedback winding 18 is coupled between the base and the emitter of transistor 15, with the dotted end of the winding being coupled to the emitter. A resistance 21 shunts the winding 18. The output of the pulse generator 13 is magnetically coupled by the winding 27 to the secondary feedback winding 18 for turning on the transistor 15 at the desired rate. Turn off of transistor 15 and thus the duration of each conduction period is determined by the characteristics of the power transformer and other circuit parameters.

Figure 2:
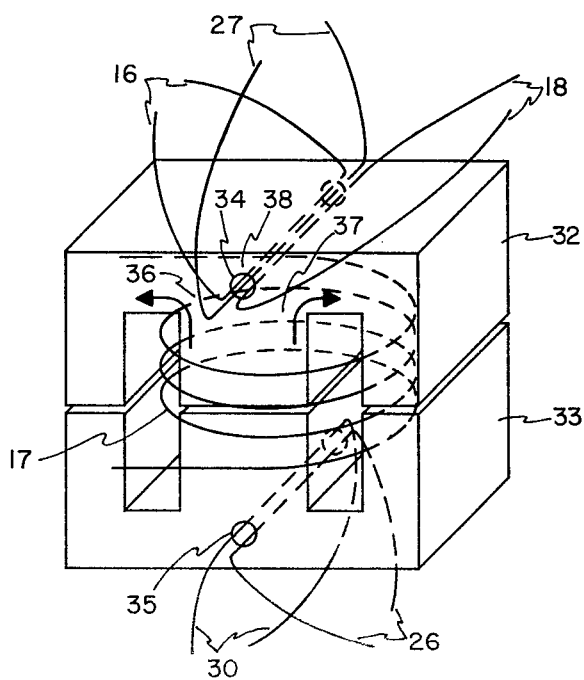
FIG. 2 is a mechanical drawing of the inverter transformer, including the main power winding, and the windings which provide feedback for the pulse generator, and coupling of the pulse generator output to the switching transistor, and all of which are compactly assembled upon a single composite core structure.

The mechanical construction of the power transformer, which forms a portion of both the main power circuit and the pulse generator, is illustrated in FIG. 2. The windings 16, 17, 18 and 26, 27 and 30 are assembled on a pair of "E" cores 32, 33. The "E" cores are assembled to form a composite core having a rectangular figure "8" configuration with optional air gaps at the three core joints. The main power winding 17, typically of 200 turns, is wound about the central leg of the core which has double the cross section of the other legs of the core. The main power winding generates a flux which circulates in a common direction through the central leg and pursues mutually opposite rotational senses in closed paths or loops in the right and left portions of the core.

The windings 16, 18, 26, 27 and 30 of the power transformer are wound through apertures 34, 35 provided in the "E" cores near the upper and lower ends respectively of the center leg. The windings 16, 18 and 27 are wound through the upper aperture 34 while the windings 26 and 30 are wound through the lower aperture 35. As illustrated, the apertures are small in relation to the cross section of the core while being large enough for insertion of the control windings which normally have a small (<10) total number of turns. Both apertures are located on the center line of the center leg close to the root of the center leg. Each aperture is positioned in a region above the aperture which is free or substantially free of main flux in the absence of saturation.

The control windings 16 and 18, considered independently of main power winding 17, form a current transformer. When no portion of the core is saturated, the core of the current transformer is a small low reluctance virtual toroid. The center of the toroid is the aperture 34 and its boundaries during this condition are the adjacent boundaries of the upper leg and central leg of the composite "8" core. Expressed in another way, the virtual toroid consists of three contiguous regions (36, 37 and 38). The first region 36 connects the upper half of the central leg to the left half of the upper leg and provides a path for both main flux in the lefthand loop of the "8" core and flux circulating in the toroid. The second region 37 connects the right half 37 of the upper leg to the upper half of the central leg and provides a path for both the main flux circulating in the right loop of the "8" core and for flux circulating in the toroid. The third region 38 lies in the upper leg and interconnects the left and right halves. Absent saturation, very little of the main flux and only toroidal flux flows in the third region 38.

Operating together, the windings 16, 17 and 18 provide a mechanism for automatically turning off transistor conduction after a prescribed interval. These windings are connected between the output electrodes of the switching transistor 15 and to the base electrode so as to provide a feedback which reverses from conduction aiding to conduction inhibiting as a function of saturation of a portion of the magnetic core. The prescribed interval is dependent upon the time that it takes the volt-time area of the NI product in the series circuit to attain a prescribed level of flux in the core at which one region (e.g. region 36) saturates. Assuming that the winding connections are suitably sensed, the circulating and main fluxes will add in this region and it will saturate first. The windings 16 and 18 are connected to transistor 15 in a sense to provide regenerative feedback via the virtual toroid 36, 37, 38 prior to saturation. After saturation, the original toroid is ineffective and as a consequence of said saturation, a degenerative voltage now appears across the winding 18 which continues until transistor 15 is swept clear of stored charge and is turned completely off.

The mechanism for drive reversal is a function of the nature of the load provided to the secondary feedback winding 18. Should the load be primarily that provided by the input junction of transistor 15, wherein the voltage drop across the input junction ($V_{bc}$) is maintained substantially constant so long as any stored charge remains, the rate of change of flux in the region 38 is clamped to a fixed ratio between that voltage and the inductance of the secondary winding. The winding inductance is, however, a function of the reluctance of the applicable flux path. In the event that a portion of the small virtual toroid becomes saturated, a new flux path appears pursuing a generally longer rectangular path around the outer perimeter of the core. When this path is designed to have a greater reluctance than that of the virtual toroid, a sharp reduction in the rate of change of flux occurs, carrying the base drive from an initially positive to a strongly negative sense.

The static inverter so far described imposes severe requirements upon the pulse generator used to turn on the switching transistor 15. The switching transistor is preferably a high current, low cost device such as is employed in a television deflection circuit. Such transistors require a very substantial amount of injected charge to ensure conduction. The transistor input junction itself, when driven in the forward direction, presents a low impedance load matching it to a low impedance current transformer. For impedance matching, the feedback circuits for turning off the switching transistor in the static inverter normally contain low inductance windings connected in shunt with the transistor input junction. These windings impose an additional requirement on the starting pulse. If the starting pulse is not sufficiently short, the inductive reactance of the winding (e.g.18) may be small enough to divert a substantial amount of the energy from the input junction. In the present circuit, a pulse duration of less than a microsecond is desirable in order to achieve an efficient and a positive turn on of the switching transistor with a minimum power switching oscillator.

The windings 26 and 30 of the power transformer are wound through the aperture 35. These windings operate independently of main flux and function to provide suitable regenerative feedback for the pulse generator 13 used to recurrently turn on the main switching transistor 15. The pulse generator itself will now be described.

The pulse generator 13 is a relaxation oscillator having magnetically coupled regenerative feedback essential to the production of a high intensity short duration trigger pulse and a biasing configuration which makes the pulse repetition rate insensitive to variations in the dc supply voltage or load.

The pulse generator consists of a NPN transistor 22 having its collector electrode connected to the positive terminal of the dc source and its base electrode connected to a voltage divider consisting of the resistances 23 and 24 connected in the order recited between the positive dc source terminal and ground. The emitter of transistor 22 is connected to ground through a series circuit consisting of forward poled diode 25, primary feedback winding 26, primary output winding 27 and the resistance 28. A capacitor 29 is provided coupled between the ungrounded terminal of the resistance 28 and the positive source terminal. Secondary feedback winding 30 is capacitively coupled by capacitance 31 across the serially connected input junction of transistor 22 and the diode 25.

The pulse generator functions as a relaxation oscillator with the capacitor 29 being recurrently charged through the resistor 28 and recurrently discharged through transistor 22. In the charge-discharge process, the voltage on the lower terminal of the capacitor falls slowly from near B+ to a value of typically 15-40 volts below B+ at a rate established by resistor 28, the size of the capacitor and the B+ potential. At the desired minimum voltage, the transistor becomes conductive, arresting the downward drop in voltage. The transistor is connected between the lower capacitor terminal and the upper B+ connected capacitor terminal transistor conduction bringing the lower capacitor terminal to a potential slightly (e.g. 2 volts) below B+. The two volt difference is equal to the sum of the voltage drop in transistor 22 (when conducting), the voltage drop in diode 25, and the voltage drops in the transformer windings 26 and 27. When the discharge stops, the charging through resistance 28 repeats.

The charge of the capacitor is arrested when the the transistor 22 becomes conductive at a voltage set by the base connected voltage divider. The emitter electrode, which is connected through the diode 25 and the low impedance windings 26 and 27 to the lower capacitor terminal, follows the potential of the lower capacitor terminal as it falls. The base electrode of transistor 28, however, which is connected to the voltage divider 23, 24 connected across the dc source, is maintained at an arbitrary fraction of the B+ potential (about 15-40 volts below B+). Thus, the transistor input junction varies from a strong (15-40 volts) backward bias precluding conduction when the capacitor begins to charge, to an eventual forward bias causing the transistor to become conductive again. Transistor conduction halts the charging process with an abrupt discharge of the capacitor. Transistor conduction occurs when the lower terminal of the capacitor 29 is approximately two diode drops below the voltage of the base of transistor 22.

The transistor turn on mechanism is affected by the parasitics of the transistor and the shunting effect of the low impedance feedback windings. At near zero base current, the base impedance is high and the transistor ac gain is low, attributable to a dc $\beta$ roll off, and to a very low high frequency cut-off due to parasitic capacity shunting the input and output terminals. Thus, the initial onset of base current conduction will not produce a greater than unity current gain condition. As the base current continues to increase, however, the base input impedance will fall and the high frequency cut off will increase, providing increasing ac gain. When the output current reaches a value where the shunting effect of the low inductive reactances of the primary and secondary feedback windings no longer keep the circuit gain below unity, effective regenerative action will occur.

With effective regeneration, full transistor conduction takes place very quickly. Current flows through the transistor 22, the diode 25, and windings 26 and 27 in a closed path carrying current from the upper to the lower terminal of the capacitor 29. The current flowing in primary feedback winding 26 induces a regeneratively sensed base drive in the secondary feedback winding 30. The feedback causes a very sudden increase in current in the transistor, permitting the capacitor to discharge quickly. The discharge through output winding 27 induces a pulse of from 0.5 to 1 ampere having a duration of approximately 200 nanoseconds in the secondary feedback winding 18. (In the example, the pulse repetition rate is 22 KHz.)

The repetition rate of the pulse generator is substantially independent of variation in the B+ voltage. This implies independence of variations in the source voltage or in the loading. Once the capacitor 29 is discharged, the rate of charge is a function of the capacitor 29, resistance 28 and the applied dc voltage. The voltage through which the capacitor must charge before discharge again occurs is also substantially proportional to the B+ potential. The potential which establishes the range of the voltage swing is the voltage applied to the base electrode of transistor 27 by the voltage divider 23, 24, and it is proportional to the full supply voltage. From this it may be seen that if the source voltage is high, the charging rate is more rapid and the voltage range through which the capacitor must charge is also greater. Similarly, if the B+ voltage falls, the charging rate falls and the voltage range through which the capacitor must charge is also reduced. In both cases, the time required for charging between discharges is substantially the same. Mathematically, the voltage on the base is a function of the B+ potential.

$$V_{bb+} = (R_1/[R_1+R_2])B+$$

where $V_{bb+}$ = base potential (referenced to B+)
B+ is the source potential
$R_1$ is the resistance of 23
$R_2$ is the resistance of 24

The voltage on the emitter is also a function of the B+ potential:

$$V_{cb+} = B+(1-e^{-t/RC})$$

where $V_{cb+}$ is the emitter potential (referenced to b+)
R is the resistance of 28
C is the capacitance of 29

Assuming that the capacitor operates between B+ and the point at which the emitter voltage and base voltage are equal in respect to B+ which neglects incidental voltage drops in the circuit; the time required for the base and emitter voltage to become equal, i.e. to cause transistor conduction, occurs when:

$$(R_1/[R_1+R_2])B+ = (1-e^{-T/RC})B+$$

Since B+ may be cancelled out of both sides of the expression, one may conclude that to a first order at least, the period between pulses is independent of the B+ potential.

The circuit is designed to operate in the linear charging range of the RC network. The capacitor 31 is selected to have a time constant shorter than the charging time of the RC network.

The circuit is also substantially immune to temperature variation. The most critical temperature dependent parameter, the variation of $V_{be}$ with temperature, is small (−2 mv/degree) so that over a substantial range of temperature (i.e. 50° C.) it remains less than a tenth of a volt and produces approximately less than a 1% change in timing assuming a 15 volt swing. In the event that greater timing stability is desired, one may use a larger voltage swing.

The circuit is basically insensitive to $I_{co}$ changes. When the transistor is on, it operates in a high current condition several orders of magnitude larger than the $I_{co}$. When the transistor is off, the current levels in the RC network are made sufficiently high for linear discharge, the current levels also being substantially greater than the $I_{co}$.

The pulse generator herein described produces very high current (0.25 to 1 ampere) pulses of short (100-500 nanoseconds) duration. Pulses of this intensity and duration are required for efficiently turning on power switching transistors such as the type MJE 13003 employed to provide power to the light source 14. The switching rate of the power transistor should be above audible frequencies in typical applications, frequently being as high as 50 KHz and on occasion in excess of 100 KHz. Throughout this frequency range it is essential that the pulse have adequate current to turn on the transistor and more particularly provide adequate injected charge for immediate high current conduction. At the same time, the pulse duration should be low to avoid excessive energy diversion into the shunting control windings. With optimum triggering efficiency, the power required of the oscillator is minimized, and the magnetics may be of minimum scale and cost. At higher operation frequencies, the peak current levels of the pulses should remain high even though the pulse durations should generally be shorter.

The high intensity, short duration currents required for turning on power transistors which require substantial injected charge, cannot be achieved with typical low cost PNP-NPN transistor pulse generators. In addition, the maximum frequency of such devices is in the audible pulse repetition range. Assuming a single transistor configuration with regenerative feedback, the feedback mechanism must achieve maximum coupling, minimum dissipation and minimum distributed capacity. These requirements are met by the use of magnetic feedback in which the individual windings have very few turns, very closely coupled by a magnetic core. A practical and low cost form for such transformers is a design in which the windings, typically less than five turns are wound on a small ferrite toroid and form a current transformer. If, as in the present applicaton, the pulse generator is employed to turn on a switching transistor which already has a transformer, utilizing a core structure, then it is often practical to employ an unused portion of that core structure. In the practical example herein described, the composite core of the power transformer is fabricated from two symmetric "E" cores each having an aperture at the root of the center leg. One aperture is required for effecting the switching operation of the main power transistor and the other aperture, which might otherwise be unused, is used for providing regenerative feedback for the pulse generator.

While the invention has been shown and described in a single circuit configuration, it should be understood that other circuit variations are possible without departing from the invention concepts. More particularly, the maintenance of constant pulse repetition rates requires that the base potential be maintained proportional to the B+ potential and that the capacitor and resistance be charged in a circuit in which the change in potential from a discharged to a charged condition also be proportional to the B+ potential. This requires that the emitter electrode be held at the dc potential of one capacitor terminal, with the other capacitor terminal being returned to either dc terminal, assuming the customary capacity between source terminals. The resistance 28, which is also connected to the one capacitor terminal may be returned to either the B+ terminal or ground. The transistor may be either an NPN or a PNP provided that the bias connections are suitably inverted. Alternately, the circuit may provide that the transistor charge the capacitor (increase the voltage between terminals) while the resistance discharges (decreases the voltage between terminals).

The high current pulse requirement of the circuit makes highly efficient core magnetics in the feedback circuit essential. At the indicated frequency ranges, ferrite materials are efficient and economical. Air core devices normally require additional turns for close coupling, and distributed capacities, resistances and inductances prevent their use in delivering a high frequency, short duration pulse to a low impedance load.

The primary feedback winding (26) may be connected in either the collector or emitter current path, and the secondary feedback winding, which provides base drive, may be connected either directly or through the capacitor 31 to the base electrodes. The latter circuit must maintain dc isolation between base and emitter electrodes.

As noted above, the dc current paths may generally be treated independently of the ac paths associated with pulse transmission. The indicated configuration is preferable to alternate configurations in that it minimizes the circulation of pulse currents in the power supply. Also, by making the feedback transformer (26, 30) an autotransformer, the turns count is a minimum.

The arrangement so far described permits one to achieve intentional upward or downward revision in the pulse repetition rate which is useful for compensation purposes. By injecting current into the connection between resistors 23 and 24, the pulse repetition rate may be increased, while current injection in the same sense into the connection between capacitor 29 and resistor 28 will cause a decrease in the pulse repetition rate.

The pulse repetition rate of the pulse generator is not affected by transients present in the load. The integrating capacitor 29, which establishes the pulse repetition rate, has excellent isolation from any pulses produced by the switching transistor 15. This isolation is true in spite of the close magnetic coupling between windings 16 and 18 associated with the switching transistor 15 and winding 27, connected into the capacitor charging circuit. Since the transistor 22 is off during the integration period, the output circuit of the pulse generator is effectively open circuited during integration. Should the pulse generator output winding 17 pick up pulses during integration, the effect on the output circuit is negligible due to the open circuit. The input circuit of the transistor 22 is also unaffected since the pulses are produced by a low impedance source at insufficient voltage to overcome the large (15 to 40 volt) reverse bias. Since the transistor 22 remains nonconductive when transients are generated in the load, the capacitor charging rate and the pulse repetition rate dependent thereon is unaffected by such transients.

The intrinsic isolation of the pulse generator circuit configuration from the power circuit avoids the need for a second buffer transistor which could provide isolation but would do so at a prohibitive increase in cost. The circuit isolation characterized above is also retained when one or both of the windings 26 and 27 are connected in the path between the collector and the B+ source terminal.

A static inverter in which an isolated frequency control is provided for the main switching transistor may be produced in accordance with the invention in a particularly compact and economic fashion. The isolation is attributable to both the pulse generator circuit design (described above), and to the magnetic design. Magnetic isolation permits the magnetic structure associated with the main switching transistor and the magnetic structure required for the feedback transformer of the pulse generator to be consolidated into a single unitary figure "8" magnetic structure without adverse interaction.

The feedback windings 26 and 30 are isolated from both the main and control fluxes. The aperture 35 employed by the feedback windings (26, 30) of the relaxation oscillator, like the aperture 34, is placed at a region of the core which is neutral with respect to the main flux. This placement maintains substantially complete isolation between the input circuit of the pulse generator and main flux flowing through the principal magnetic structure.

Isolation of the feedback windings from the control fluxes is achieved by the mutually remote placement of the aperture 35 from the aperture 34 which precludes direct magnetic interaction between the windings in the separate apertures. This is true because the fluxes generated by these windings are normally confined to the small toroidal regions centered around each aperture, which regions do not meet. The magnetic isolation between the windings in separate apertures is maintained even during drive reversal accompanying partial saturation of the toroid associated with aperture 34. Partial saturation forces control flux into the main flux paths. Isolation is maintained during this interval partly because of the greatly reduced relative magnitude of the control flux, when it pursues the high reluctance outer path, in relation to the higher flux levels established in the low reluctance toroidal paths by the feedback windings 26, 30 and partly because of the low impedance of the feedback windings which produce insufficient voltage to overcome the normal reverse bias of the input junction, which is present during most of the capacitor charging cycle. In the event that some practical interference does exist, one may reverse the sense of the windings in the aperture 34 with respect to the windings in the aperture 35 so that the effect of the stray flux on transistor 22 is to further turn it off rather than to turn it on.

In short, the provision of electrical circuit isolation between the main switching transistor circuit and the pulse generator, while the two are in fact electrically connected together and the provision of magnetic isolation, while the two share a common core structure permits a sophisticated static converter to be assembled into a compact package of minimum cost.

While the disclosed static inverter has employed "E" cores in a figure "8" configuration, with a single hole aperture at each end of the common leg for coupling to a region neutral to the main flux, one may also use a core having a single loop configuration, typically formed from two "C" cores. In this arrangement, coupling to a region neutral to the main flux may be achieved by two mutually remote, two aperture sets. The apertures are each oriented parallel to the main flux, so that a winding wound through an aperture set is uncoupled to the main flux—absent saturation effects.

What is claimed as new and desired be secured by Letters Patent of the United States is:

1. A relaxation oscillator for generating short duration, high current pulses at a stable repetition rate, comprising:

A. a source of dc potentials having a first and a second output terminal,

B. a resistor having one terminal connected to said second source output terminal, c. a junction transistor having base, emitter and collector electrodes, the collector thereof being coupled in a first low resistance, conductive path to said first source output terminal, the emitter thereof being coupled in a second low resistance, conductive path to the other terminal of said resistor, D. means to establish the base electrode at a potential intermediate to that of said dc source terminals, E. a capacitor which is alternately charged and discharged having a first terminal coupled to the other terminal of said resistor and through said second path to said emitter and a second terminal coupled to one of said source output terminals, the potential across said capacitor establishing the potential on said emitter electrode relative to said base electrode and thereby controlling the state of conduction of said transistor; the duration of transistor conduction being determined by the level of transistor conduction and the capacity of said capacitor; and the duration of nonconduction being determined by the resistance of said resistor and the capacity of said capacitor, and F. a current transformer having a low impedance primary winding closely coupled through a magnetic core to a low impedance secondary winding, said primary winding being connected in one of said low resistance conductive paths, and said secondary winding being capacitively coupled between said base and said emitter electrodes in a third low resistance path, said transformer providing feedback in a regenerative sense to produce short duration, high current pulses when said transistor conduction occurs.

2. A pulse generator as set forth in claim 1 wherein said capacitor is coupled to said first source output terminal.

3. A pulse generator as set forth in claim 2 wherein said base electrode establishing means comprises a resistive voltage divider coupled between said source output terminals having a tap coupled to said base electrode.

4. A pulse generator as set forth in claim 3 wherein said primary feedback winding and said secondary feedback winding form an auto transformer, the primary portion of said auto transformer being connected in said second low resistance conductive path.

5. A pulse generator as set forth in claim 4 wherein the output of said pulse generator is derived by means of a second transformer having a low impedance primary winding connected in one of said low resistance conductive paths and a low impedance secondary winding closely coupled thereto by a magnetic core to provide current transformer action.

6. A relaxation oscillator for generating short duration, high current pulses at a stable repetition rate, comprising:

A. a source of dc potentials having a first and a second output terminal,

B. a resistor having one terminal connected to said second source output terminal, C. a junction transistor having base, emitter and collector electrodes, the collector thereof being coupled in a first low resistance, conductive path to said first source output terminal, the emitter thereof being coupled in a second low resistance, conductive path to the other terminal of said resistor, D. means to establish the base electrode at a potential intermediate to that of said dc source terminals, E. a capacitor which is alternately charged and discharged having a first terminal coupled to the other terminal of said resistor and through said second path to said emitter and a second terminal coupled to one of said source output terminals, the potential across said capacitor establishing the potential on said emitter electrode relative to said base electrode and thereby controlling the state of conduction of said transistor; the duration of transistor conduction being determined by the level of transistor conduction and the capacity of said capacitor; and the duration of nonconduction being determined by the resistance of said resistor and the capacity of said capacitor, and F. a power transformer, and a first current transformer sharing a common magnetic structure, (1) said power transformer comprising a power winding cooupled to said magnetic structure which provides a magnetic path suitable for main power flux, and (2) said first current transformer associated with a first aperture means in said common magnetic structure defining a first small portion of said common magnetic structure substantially free of main magnetic flux, said first current transformer having a first low impedance primary winding closely coupled magnetically to a second low impedance secondary winding for current transformer action, said first low impedance primary winding being connected in one of said low resistance conductive paths, and said second low impedance secondary winding being capacitively coupled between said base and said emitter electrodes in a third low resistance path, said transformer providing feedback in a regenerative sense to produce short duration, high current pulses when said transistor conduction occurs.

7. The combination set forth in claim 6 having in addition thereto:

a second current transformer sharing said common magnetic structure, said second current transformer being associated with a second aperture means in said common magnetic structure substantially free of main flux, said second current transformer comprising a third low impedance primary winding connected in series with said transistor output electrodes and a fourth low impedance secondary winding closely coupled magnetically to said third low impedance winding for current transformer action, and a power switching transistor for controlling current in said power winding having base and emitter electrodes coupled to said fourth low impedance secondary winding for causing conduction of said switching transistor in response to pulses generated by said pulse generator.

* * * * *